United States Patent
Rowell et al.

(10) Patent No.: US 10,914,774 B2
(45) Date of Patent: Feb. 9, 2021

(54) MEASUREMENT METHOD AND SYSTEM FOR INCREASING THE EFFECTIVE SIZE OF A QUIET ZONE

(71) Applicant: Rohde & Schwarz GmbH & Co. KG, Munich (DE)

(72) Inventors: Corbett Rowell, Munich (DE); Benoit Derat, Munich (DE); Vincent Abadie, Hohenschaeftlarn (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/380,553

(22) Filed: Apr. 10, 2019

(65) Prior Publication Data
US 2019/0391196 A1    Dec. 26, 2019

(30) Foreign Application Priority Data
Jun. 20, 2018    (EP) .................................. 18178683

(51) Int. Cl.
*H01Q 3/34* (2006.01)
*G01R 29/10* (2006.01)
*H01Q 3/02* (2006.01)

(52) U.S. Cl.
CPC ............ *G01R 29/10* (2013.01); *H01Q 3/02* (2013.01); *H01Q 3/34* (2013.01)

(58) Field of Classification Search
CPC ............ H01Q 3/34; H01Q 3/36; H01Q 3/247; H01Q 3/2676; H04B 17/12; H04B 17/16; H04B 17/21; G01R 29/10; G01R 29/105
USPC ............ 343/755, 778, 779; 455/67.11, 115.1
See application file for complete search history.

(56) References Cited

U.S. PATENT DOCUMENTS

| | | | | |
|---|---|---|---|---|
| 6,031,498 A | * | 2/2000 | Issler | G01R 29/10 342/351 |
| 10,768,216 B2 | * | 9/2020 | Abadie | H04B 17/309 |
| 2011/0134001 A1 | * | 6/2011 | Sakata | H01Q 3/267 343/703 |
| 2012/0225624 A1 | * | 9/2012 | Kyosti | H01Q 21/205 455/67.11 |

(Continued)

FOREIGN PATENT DOCUMENTS

| | | |
|---|---|---|
| TW | 298690 B | 2/1997 |
| WO | 9738464 A1 | 10/1997 |

OTHER PUBLICATIONS

Parini et al., "Optimizing a CATR quiet zone using an array feed", AMTA 2016 Proceddings, Oct. 1, 2016, published in Queen Mary University of London, London, U. K., pp. 401-406, 6 pages.

(Continued)

*Primary Examiner* — Tung X Le
(74) *Attorney, Agent, or Firm* — Ditthavong & Steiner P.C.

(57) ABSTRACT

A measurement method for increasing the effective size of a quiet zone is provided. The measurement method comprises the step of in the case that an amplitude and/or a phase distribution of the quiet zone is known, determining a set of correction factors on the basis of said amplitude and/or phase distribution of the quiet zone. Additionally or alternatively in the case that the amplitude and/or phase distribution of the quiet zone and an antenna radiating aperture location on a device under test are known, the device under test is centered in the middle of the quiet zone and the device under test is moved radially in at least one axis.

15 Claims, 9 Drawing Sheets

(56) References Cited

U.S. PATENT DOCUMENTS

| | | | |
|---|---|---|---|
| 2013/0027256 A1* | 1/2013 | Guo | H04W 24/06 343/703 |
| 2013/0052962 A1* | 2/2013 | Hansen | G01R 29/105 455/67.12 |
| 2015/0030060 A1* | 1/2015 | Kyosti | H04B 17/0087 375/224 |
| 2017/0242061 A1 | 8/2017 | Gottl et al. | |
| 2018/0034562 A1* | 2/2018 | Foegelle | H04B 17/0085 |
| 2019/0036621 A1* | 1/2019 | Vanwiggeren | H04B 17/354 |

OTHER PUBLICATIONS

Hirvonen et al., "A compact Antenna Test Range Based on a Hologram", Published in IEEE Transactions on Antennas and Propagation, IEEE Service Center, Piscataway, NJ, US, vol. 45 , Issue: 8 , Aug. 1, 1997, pp. 1270-1276, 7 pages.

Parini et al., "Use of Quiet Zone Prediction in the Design of Compact Antenna Test Ranges", : Published in IEE Proceedings—Microwaves, Antennas and Propagation, vol. 143 , Issue: 3 , Jun. 1996, pp. 193-199, 7 pages.

\* cited by examiner

MEASUREMENT METHOD AND SYSTEM FOR INCREASING THE EFFECTIVE SIZE OF A QUIET ZONE

PRIORITY

This application claims priority of European patent application EP 18 178 683.1 filed on Jun. 20, 2018 which is incorporated by reference herewith.

FIELD OF THE INVENTION

The invention relates to a measurement method and a corresponding measurement system for increasing the effective size of a quiet zone.

BACKGROUND OF THE INVENTION

Generally, in times of an increasing number of applications providing wireless connectivity capabilities, there is a growing need of a measurement method and a corresponding measurement system especially for verifying correct functioning of said applications, whereby the effective size of a quiet zone is increased in order to ensure measuring in a highly efficient and cost-effective manner.

WO 97/38464 A1 discloses test methods to measure co-polarization and cross-polarization properties of an antenna. In particular, said document relates to an apparatus and method to measure these properties in a compact range facility having a feed and reflector system that provides a quiet zone in which a radiation field is uniformly polarized. However, due to the fact that an enlargement of said quiet zone is not proposed, the usage of said apparatus or method, respectively, disadvantageously leads to a limited accuracy, and thus also to a reduced efficiency.

Accordingly, there is a need to provide a measurement method for increasing the effective size of a quiet zone and a corresponding measurement system ensuring both a high accuracy and an increased efficiency, whereby costs can additionally be reduced.

According to a first aspect of the invention, a measurement method for increasing the effective size of a quiet zone is provided. The measurement method comprises the step of in the case that an amplitude and/or a phase distribution of the quiet zone is pre-calibrated, determining a set of correction factors on the basis of said amplitude and/or phase distribution of the quiet zone. Additionally or alternatively in the case that the amplitude and/or phase distribution of the quiet zone and an antenna radiating aperture location on a device under test are known, it comprises the step of centering the device under test in the middle of the quiet zone and moving the device under test radially in at least one axis. Advantageously, accuracy and efficiency can be increased.

According to a first preferred implementation form of said first aspect of the invention, a pre-calibration of the amplitude and/or a phase distribution of the quiet zone is done by the following steps of moving a measurement antenna through the quiet zone in a planar or three-dimensional manner, and measuring amplitude and/or phase for a set of locations within the quiet zone with the aid of the measurement antenna. In addition to this, it is noted that the above-mentioned respective correction factor especially describes amplitude and/or phase at different points in the quiet zone.

According to a second preferred implementation form of said first aspect of the invention, the measurement method further comprises the step of in the case that the amplitude and/or phase distribution of the quiet zone and the antenna radiating aperture location on the device under test are known, applying the respective correction factor of the set of correction factors for a desired set of positions of the antenna radiating aperture in the quiet zone. Advantageously, accuracy and efficiency can further be increased.

According to a third preferred implementation form of said first aspect of the invention, the measurement method further comprises the steps of in the case that the amplitude and phase distribution of the quiet zone is unknown, centering the antenna radiating aperture in the middle of the quiet zone and measuring a first peak gain of a corresponding boresight beam, and/or in the case that the amplitude and phase distribution of the quiet zone is unknown, centering the device under test in the middle of the quiet zone and measuring a second peak gain of the corresponding boresight beam, and using the offset between the first peak gain and the second peak gain as a correction factor in the case that the device under test is centered in the quiet zone. Advantageously, measurement errors can be reduced.

According to a further preferred implementation form of said first aspect of the invention, the measurement method further comprises the step of assuming that there is a constant distance of the center of the antenna aperture from the center of the quiet zone. Advantageously, complexity can be reduced.

According to a further preferred implementation form of said first aspect of the invention, the measurement method further comprises the step of in the case that the location of at least one antenna of the device under test is unknown, measuring the device under test in at least two, preferably at least four, more preferably four orthogonal locations, with at least one corresponding boresight beam and comparing the corresponding peak value differences with the known amplitude and/or phase distribution of the quiet zone in order to determine the location of the at least one antenna of the device under test. Advantageously, measurement errors can further be reduced.

According to a further preferred implementation form of said first aspect of the invention, the measurement method further comprises the step of increasing the effective size of the quiet zone such that the antenna radiating aperture of the device under test is smaller than the respective diameter of the enlarged quiet zone. Advantageously, accuracy and measurement efficiency can further be increased.

According to a second aspect of the invention, a measurement system for increasing the effective size of a quiet zone is provided. The measurement system comprises a device under test, a measurement equipment, and a device under test positioner. In this context, in the case that an amplitude and/or a phase distribution of the quiet zone is pre-calibrated, the measurement equipment is configured to determine a set of correction factors on the basis of said amplitude and/or phase distribution of the quiet zone.

Alternatively or additionally in the case that the amplitude and/or phase distribution of the quiet zone and an antenna radiating aperture location on the device under test are known, the device under test positioner is configured to center the device under test in the middle of the quiet zone and to move the device under test radially in at least one axis. Advantageously, accuracy and efficiency can be increased.

According to a first preferred implementation form of said second aspect of the invention, the measurement system further comprises a measurement antenna being movable through the quiet zone in a planar or three-dimensional manner. In this context, for a pre-calibration of the amplitude and/or a phase distribution of the quiet zone, the measurement equipment is further configured to measure amplitude and/or phase for a set of locations within the quiet zone with the aid of the movable measurement antenna. In addition to this, it is noted that the above-mentioned respective correction factor especially describes amplitude and/or phase at different points in the quiet zone.

According to a second preferred implementation form of said second aspect of the invention, in the case that the amplitude and/or phase distribution of the quiet zone and the antenna radiating aperture location on the device under test are known, the measurement equipment is configured to apply the respective correction factor of the set of correction factors for a desired set of positions of the antenna radiating aperture in the quiet zone. Advantageously, accuracy and efficiency can further be increased.

According to a third preferred implementation form of said second aspect of the invention, in the case that the amplitude and phase distribution of the quiet zone is unknown, the device under test positioner is configured to center the antenna radiating aperture in the middle of the quiet zone, wherein the measurement equipment is configured to measure a first peak gain of a corresponding boresight beam, and/or wherein in the case that the amplitude and phase distribution of the quiet zone is unknown, the device under test positioner is configured to center the device under test in the middle of the quiet zone, wherein the measurement equipment is configured to measure a second peak gain of the corresponding boresight beam, and wherein the measurement equipment is configured to use the offset between the first peak gain and the second peak gain as a correction factor in the case that the device under test is centered in the quiet zone. Advantageously, measurement errors can be reduced.

According to a further preferred implementation form of said second aspect of the invention, it is assumed that there is a constant distance of the center of the antenna aperture from the center of the quiet zone. Advantageously, complexity can be reduced.

According to a further preferred implementation form of said second aspect of the invention, in the case that the location of at least one antenna of the device under test is unknown, the measurement equipment is further configured to measure the device under test in at least two, preferably at least four, more preferably four orthogonal locations, with at least one corresponding boresight beam and to compare the corresponding peak value differences with the known amplitude and/or phase distribution of the quiet zone in order to determine the location of the at least one antenna of the device under test. Advantageously, measurement errors can further be reduced.

According to a further preferred implementation form of said second aspect of the invention, the measurement equipment is further configured to increase the effective size of the quiet zone such that the antenna radiating aperture of the device under test is smaller than the respective diameter of the enlarged quiet zone. Advantageously, accuracy and measurement efficiency can further be increased.

According to a further preferred implementation form of said second aspect of the invention, the measurement system further comprises at least one feed antenna configured to transmit and/or receive signals with respect to the communication between the device under test and the measurement equipment, and wherein the at least one feed antenna is further configured to create the quiet zone on the device under test positioner, wherein the quiet zone comprises a certain shape. Advantageously, for instance, field variations can exactly be determined with respect to said certain shape.

According to a further preferred implementation form of said second aspect of the invention, the measurement equipment is further configured to apply the respective correction factor outside, preferably radially outside, the certain shape in order to compensate for quiet zone amplitude distribution variations. Advantageously, the quiet zone may be provided with plain waves within said certain shape.

According to a further preferred implementation form of said second aspect of the invention, the measurement system further comprises at least one reflector, preferably at least one shaped reflector, configured to establish the quiet zone with respect to the device under test. In addition to this or as an alternative, the measurement system further comprises at least one alignment segment configured to position the at least one reflector, preferably the at least one shaped reflector. Advantageously, the quiet zone can efficiently be formed.

BRIEF DESCRIPTION OF THE DRAWINGS

Exemplary embodiments of the invention are now further explained with respect to the drawings by way of example only, and not for limitation. In the drawings.

DETAILED DESCRIPTION OF PREFERRED EMBODIMENTS

Figure 1:
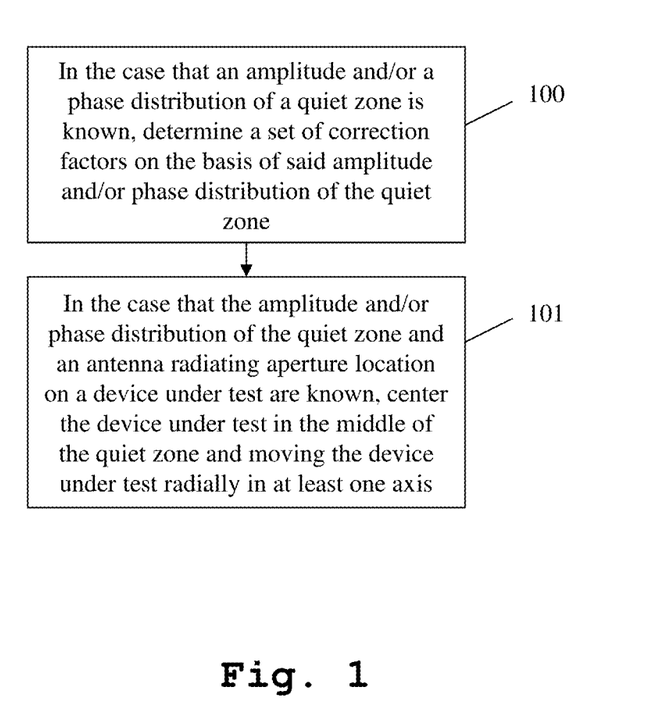
FIG. 1 shows a flow chart of an exemplary embodiment of the first aspect of the invention.

Firstly, FIG. 1 shows a flow chart of an exemplary embodiment of the inventive measurement method for increasing the effective size of a quiet zone. In a first step 100, in the case that an amplitude and/or a phase distribution of the quiet zone is known, a set of correction factors is determined on the basis of said amplitude and/or phase distribution of the quiet zone. Then, additionally or alternatively, in a second step 101, in the case that the amplitude and/or phase distribution of the quiet zone and an antenna radiating aperture location on a device under test are known, the device under test is centered in the middle of the quiet zone and moving the device under test radially in at least one axis.

In addition to this, the inventive method may further comprise the step of in the case that the amplitude and/or phase distribution of the quiet zone and the antenna radiating aperture location on the device under test are known, applying the respective correction factor of the set of correction factors for a desired set of positions of the antenna radiating aperture in the quiet zone.

Additionally or alternatively, the measurement method may further comprise the steps of in the case that the amplitude and phase distribution of the quiet zone is unknown, centering the antenna radiating aperture in the middle of the quiet zone and measuring a first peak gain of a corresponding boresight beam, and/or in the case that the amplitude and phase distribution of the quiet zone is unknown, centering the device under test in the middle of the quiet zone and measuring a second peak gain of the corresponding boresight beam, and whereby using the offset between the first peak gain and the second peak gain as a correction factor in the case that the device under test is centered in the quiet zone.

It might be further advantageous if the measurement method further comprises the step of assuming that there is a constant distance of the center of the antenna aperture from the center of the quiet zone.

Moreover, it is noted that the method according to the first aspect of the invention may further comprise the step of in the case that the location of at least one antenna of the device under test is unknown, measuring the device under test in at least two, preferably at least four, more preferably four orthogonal locations, with at least one corresponding boresight beam and comparing the corresponding peak value differences with the known amplitude and/or phase distribution of the quiet zone in order to determine the location of the at least one antenna of the device under test.

In addition to this or as an alternative, the inventive method may further comprise the step of increasing the effective size of the quiet zone such that the antenna radiating aperture of the device under test is smaller than the respective diameter of the enlarged quiet zone.

Figure 2:
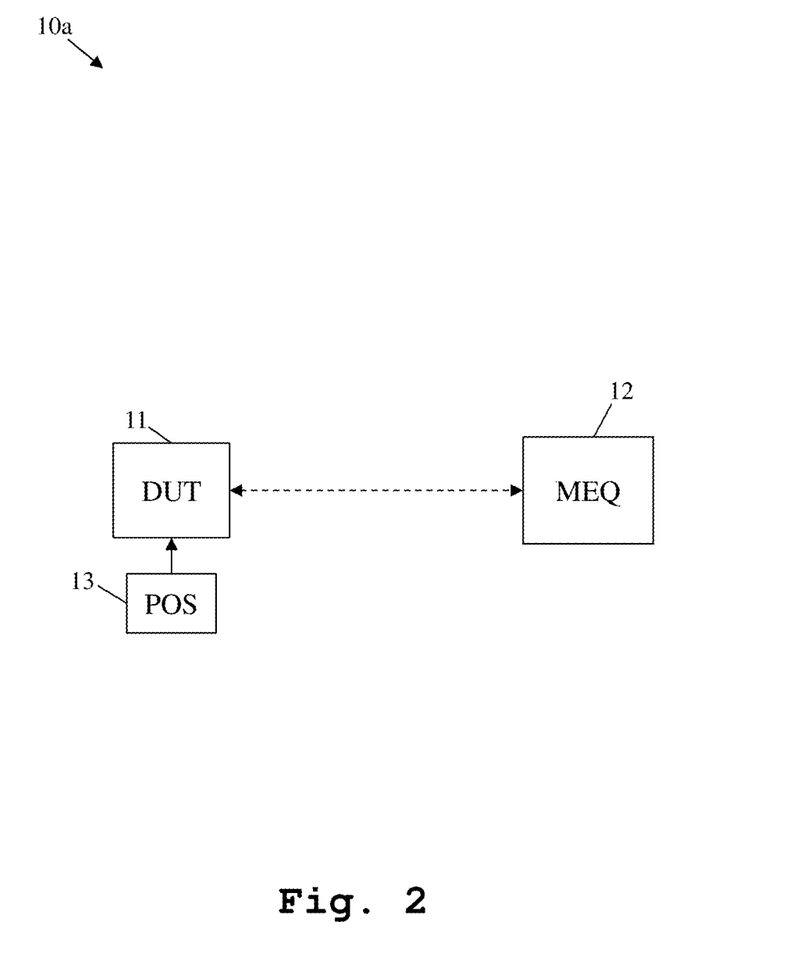
FIG. 2 shows an exemplary embodiment of the second aspect of the invention.

Now, with respect to FIG. 2, an exemplary embodiment of the inventive measurement system 10a for increasing the effective size of a quiet zone is illustrated. Said measurement system 10a comprises a device under test 11, a measurement equipment 12, and a device under test positioner 13.

In this context, in the case that an amplitude and/or a phase distribution of the quiet zone is known, the measurement equipment 12 is configured to determine a set of correction factors on the basis of said amplitude and/or phase distribution of the quiet zone.

In addition to this, in the case that the amplitude and/or phase distribution of the quiet zone and an antenna radiating aperture location on the device under test 11 are known, the device under test positioner 13 is configured to center the device under test 11 in the middle of the quiet zone and to move the device under test 11 radially in at least one axis.

Additionally or alternatively, in the case that the amplitude and/or phase distribution of the quiet zone and the antenna radiating aperture location on the device under test 11 are known, the measurement equipment 12 may further be configured to apply the respective correction factor of the set of correction factors for a desired set of positions of the antenna radiating aperture in the quiet zone.

In further addition to this or as a further alternative, in the case that the amplitude and phase distribution of the quiet zone is unknown, the device under test positioner 13 may further be configured to center the antenna radiating aperture in the middle of the quiet zone, wherein the measurement equipment 12 may further be configured to measure a first peak gain of a corresponding boresight beam.

In this context, it might be particularly advantageous if in the case that the amplitude and phase distribution of the quiet zone is unknown, the device under test positioner 13 may further be configured to center the device under test 11 in the middle of the quiet zone, wherein the measurement equipment 12 may further be configured to measure a second peak gain of the corresponding boresight beam.

Moreover, the measurement equipment 12 may advantageously be configured to use the offset between the first peak gain and the second peak gain as a correction factor in the case that the device under test 11 is centered in the quiet zone.

It is further noted that it might be assumed that there is a constant distance of the center of the antenna aperture from the center of the quiet zone.

Further additionally or alternatively, in the case that the location of at least one antenna of the device under test 11 is unknown, the measurement equipment 12 may advantageously be configured to measure the device under test 11 in at least two, preferably at least four, more preferably four orthogonal locations, with at least one corresponding boresight beam and to compare the corresponding peak value differences with the known amplitude and/or phase distribution of the quiet zone in order to determine the location of the at least one antenna of the device under test 11.

It might be particularly advantageous if the measurement equipment 12 may further be configured to increase the effective size of the quiet zone such that the antenna radiating aperture of the device under test is smaller than the respective diameter of the enlarged quiet zone.

Figure 3:
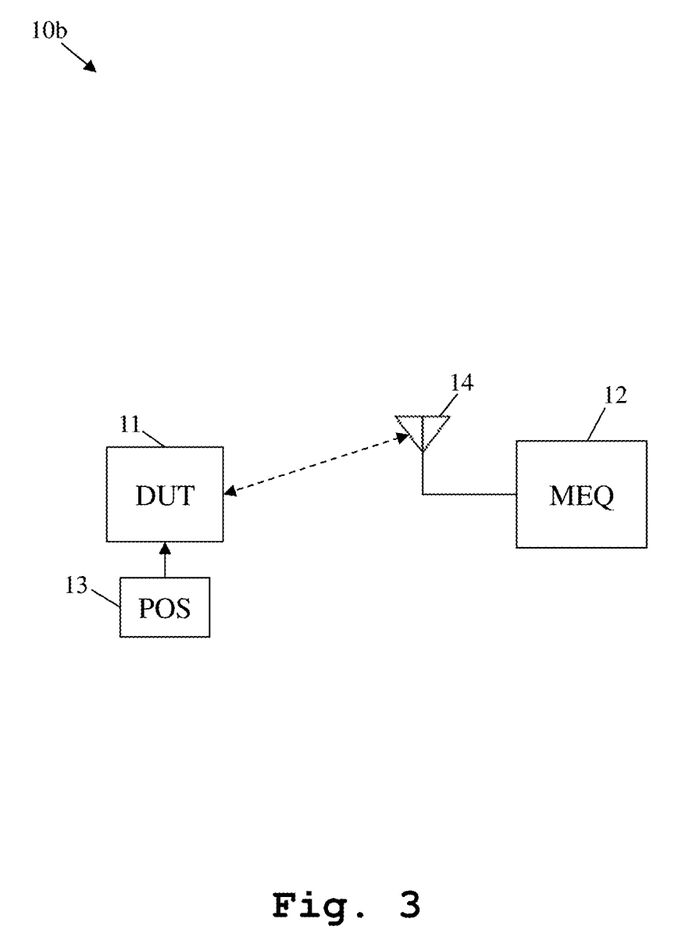
FIG. 3 shows a second exemplary embodiment of the second aspect of the invention.

Moreover, FIG. 3 depicts a second exemplary embodiment of the inventive measurement system 10b, which differs from the first embodiment 10a according to FIG. 2 in that the measurement system 10b further comprises at least one feed antenna, exemplarily feed antenna 14, configured to transmit and/or receive signals with respect to the communication between the device under test 11 and the measurement equipment 12.

In addition to this, the at least one feed antenna or antenna 14, respectively, may further be configured to especially create the quiet zone on the device under test positioner 13, wherein the quiet zone may preferably comprise a certain shape.

With special respect to said certain shape, it might be particularly advantageous if the measurement equipment 12 may further be configured to apply the respective correction factor outside, preferably radially outside, the certain shape in order to compensate for quiet zone amplitude distribution variations.

Figure 4:
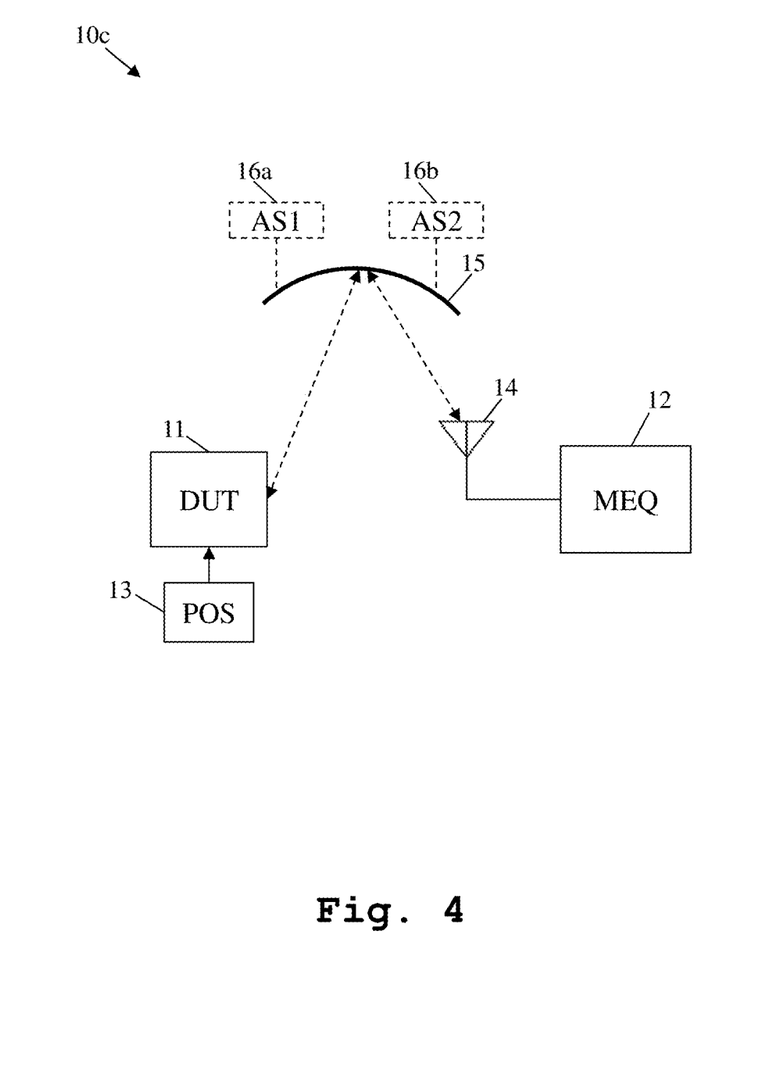
FIG. 4 shows a third exemplary embodiment of the second aspect of the invention.

Furthermore, FIG. 4 illustrates a third exemplary embodiment 10c of the inventive measurement system. Said third embodiment 10c further comprises at least one reflector, preferably at least one shaped reflector, exemplarily the reflector 15, configured to establish the quiet zone with respect to the device under test 11.

In addition to this or as an alternative, the measurement system 10c may further comprise at least one alignment segment, exemplarily the alignment segments 16a, 16b, configured to position the at least one reflector or the reflector 15, respectively.

Figure 5:
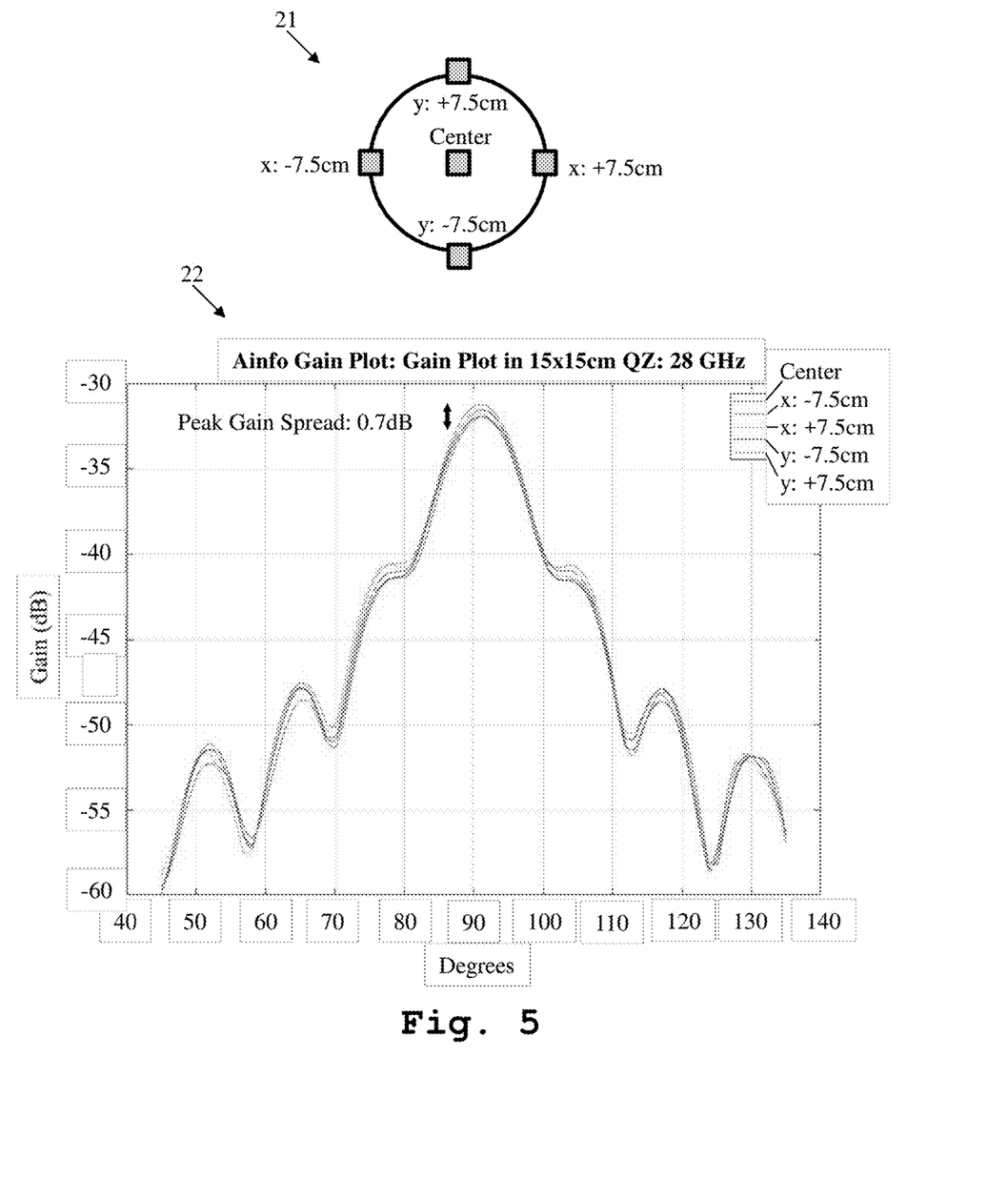
FIG. 5 shows exemplary device under test gain patterns with respect to a quiet zone.

Now, in accordance with FIG. 5, exemplary gain patters of a device under test with respect to an exemplary quiet zone 21 are depicted in diagram 22.

As it can be seen, said exemplary quiet zone 21 has a size of 15 cm*15 cm. In this context, the different positions (center, x=−7.5 cm, x=+7.5 cm, y=−7.5 cm, y=+7.5 cm) of the device under test antenna with respect to the quiet zone lead to an exemplary peak gain spread of 0.7 dB at a frequency of 28 GHz.

Figure 6:
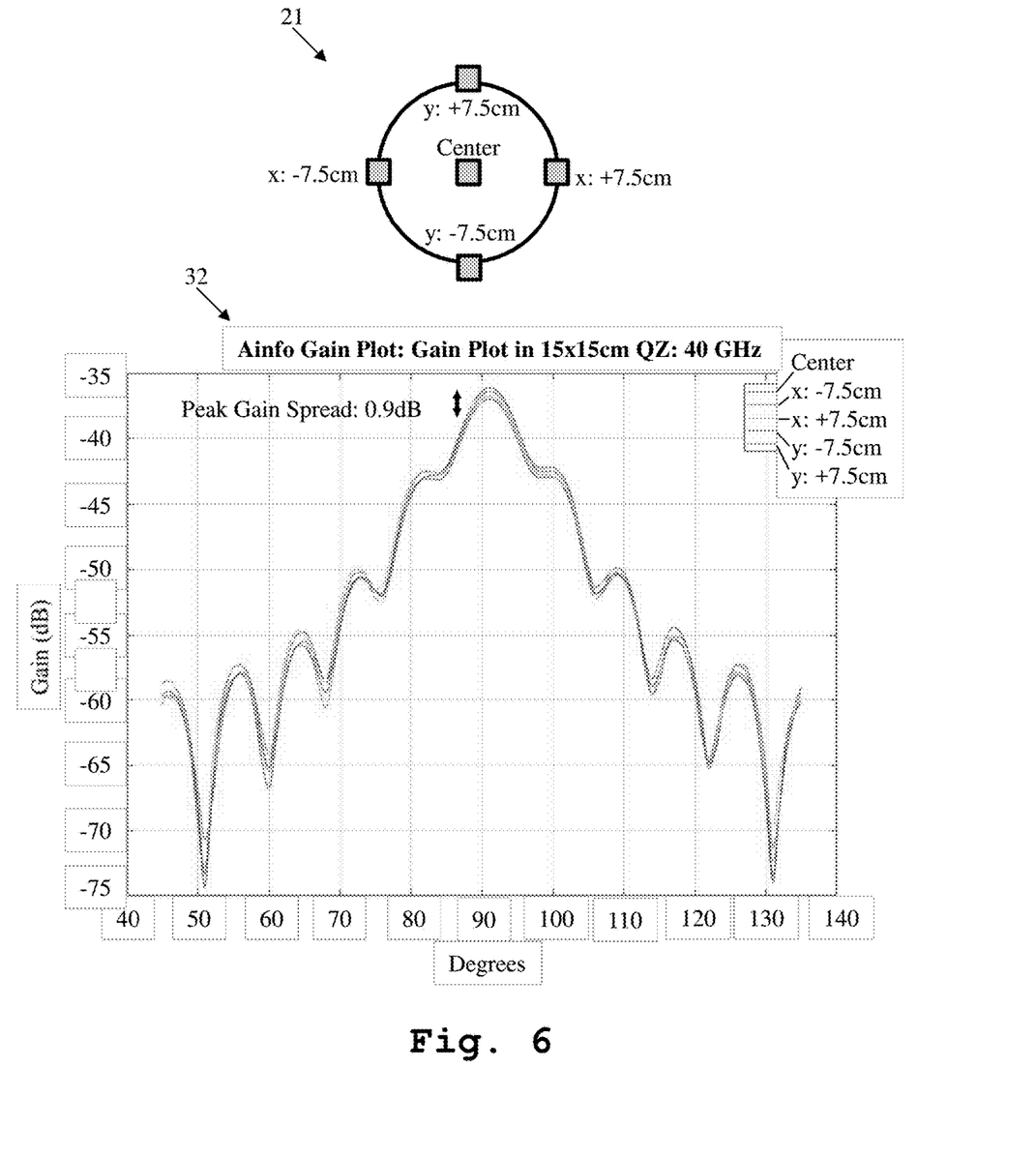
FIG. 6 shows further exemplary device under test gain patterns with respect to the quiet zone.

By analogy with FIG. 5, FIG. 6 illustrates the same exemplary quiet zone 21 and the corresponding gain patterns at a higher measurement frequency of 40 GHz. Disadvantageously, said higher measurement frequency leads to a higher peak gain spread of 0.9 dB.

Figure 7:
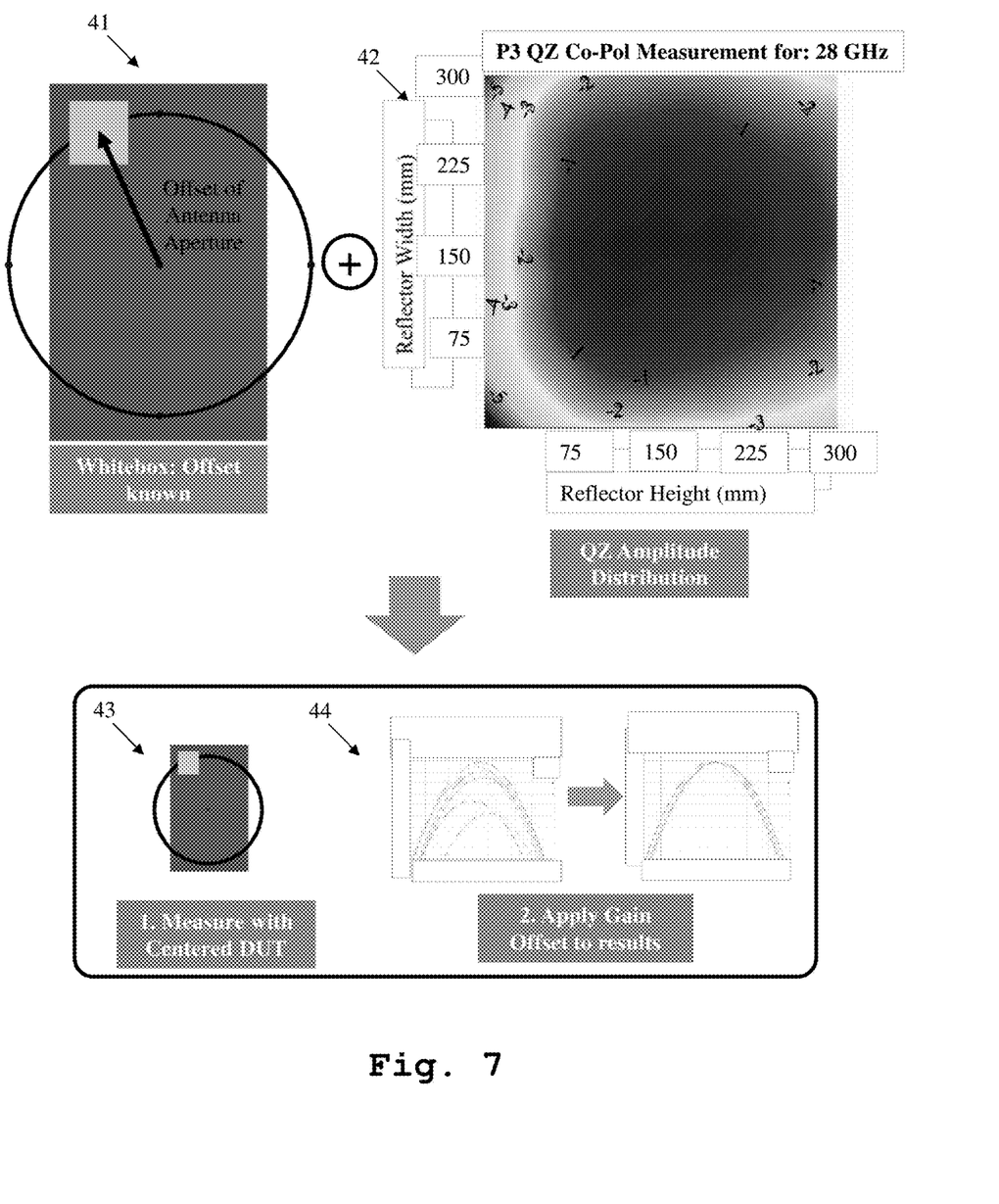
FIG. 7 shows an exemplary correction process on the basis of a device under test as a white box.

The above-mentioned peak gain spread can advantageously be reduced with the aid of the invention. In this context, FIG. 7 depicts an exemplary correction process, wherein the respective device under test is especially seen as a white box 41. In other words, the offset of the antenna aperture with respect to the device under test is known.

In addition to the white box device under test, the respective quiet zone amplitude distribution has been measured, preferably in the form of a heat map 42, with respect to the corresponding reflector, especially regarding the width and the height thereof.

Now, after a measurement with the centered device under test 43, the respective gain offset can be applied to the results for an adequate correction.

Figure 8:
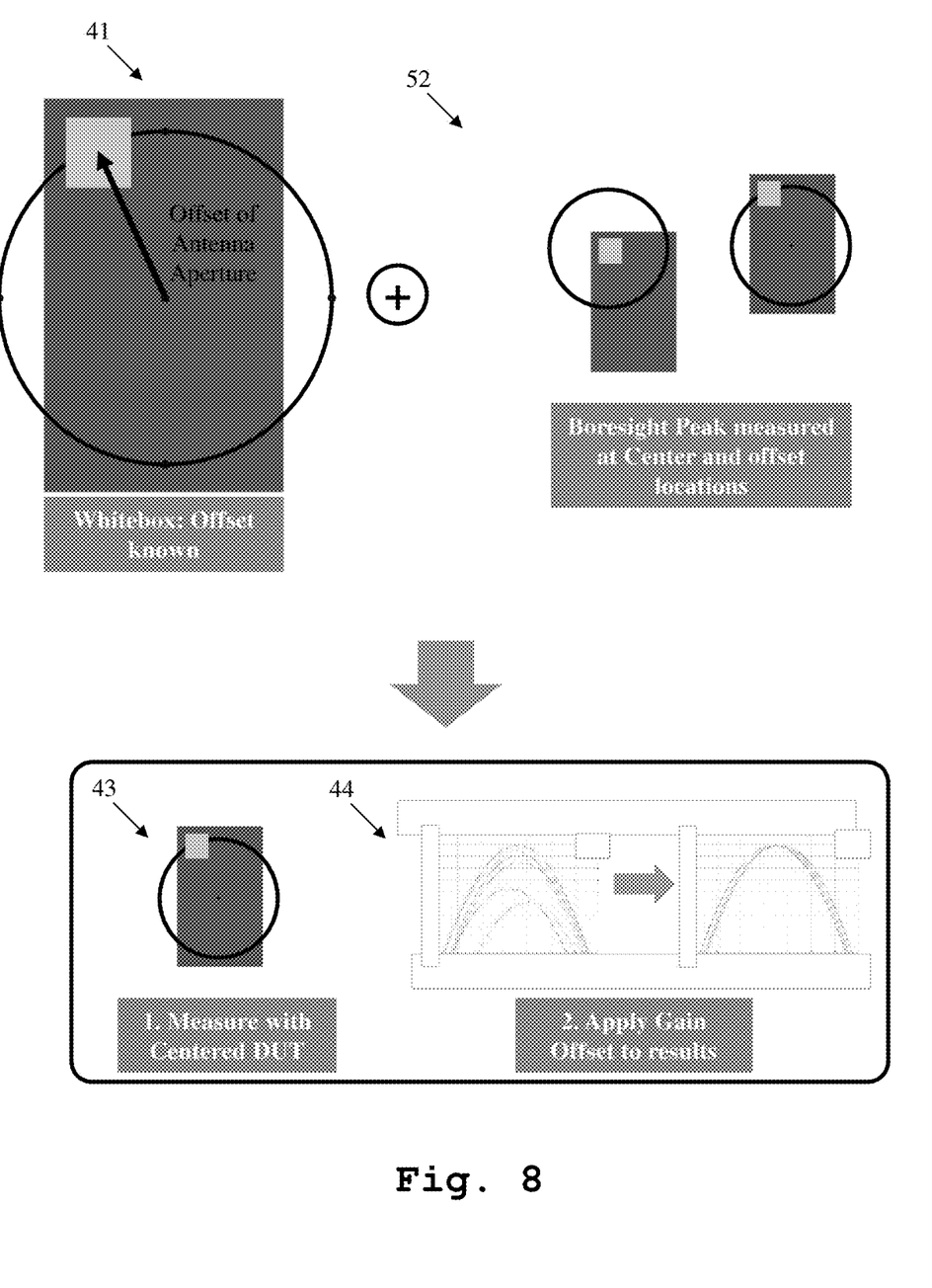
FIG. 8 shows a further exemplary correction process on the basis of a device under test as a white box.

Moreover, FIG. 8 illustrates a further exemplary correction process, wherein the respective device under test is also seen as a white box 41, and which differs from FIG. 7 in that the measurement of the heat map 42 has been replaced by boresight peak measurements 52 at center and at least one offset location.

Figure 9:
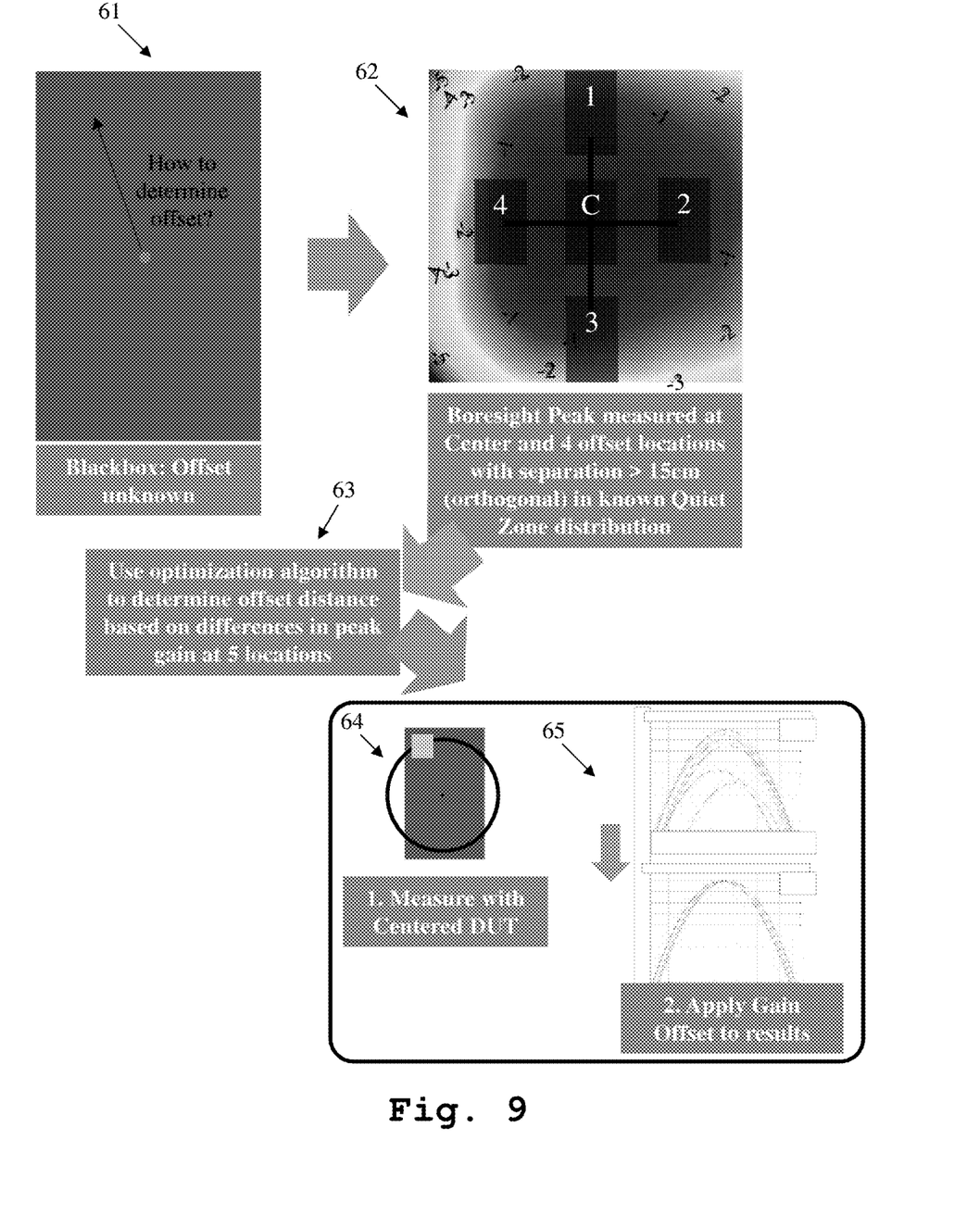
FIG. 9 shows a further exemplary correction process on the basis of a device under test as a black box.

Furthermore, FIG. 9 shows a further exemplary correction process, wherein the respective device under test is especially seen as a black box 61. In other words, the offset of the antenna aperture with respect to the device under test is unknown.

After boresight peak measurements at center and four orthogonal offset locations with separation being especially greater than 15 cm in known quiet zone distribution 62, according to step 63, an optimization algorithm is used in order to determine an offset distance based on differences in peak gain at five locations. In this context, it is generally noted that said separation between the offset locations is preferably greater than the largest dimension of the respective quiet zone.

Then, after a measurement with the centered device under test 43, the respective gain offset can be applied to the results for an adequate correction.

Finally, in addition to all the explanations above, the following should be noted:

With special respect to FIG. 4, the optional alignment segments 16a, 16b may not also be configured to align the reflector 15 but also to align the feed antenna 14.

Generally, the combination of the feed antenna 14 and the reflector 15 ensures a quiet zone of a certain size. The size of the quiet zone is critical and the size of the quiet zone is especially ensured in a device under test placement region preferably corresponding to the center region of the reflector 15. Outside the center, the quality of the quiet zone basically deteriorates.

As a consequence of this, for instance, a device under test of rectangular shape with antenna or antennas, respectively, in corner would lead to the need of enlarging the respective measurement chamber if the measurement would be performed with antenna in center. In addition to this, the respective device under test positioner 13 would have to be able to compensate the unequal load. Such disadvantages can be avoided with the aid of the invention.

Furthermore, within the scope of the invention, a known quiet zone especially means that the quiet zone is measured beforehand with a reference antenna.

Moreover, a correction factor in the sense of the invention may substantially correspond to the taper of the reflector 15. Advantageously, by applying said correction factor, an accurate measurement can especially be achieved despite the measurement being performed outside the center of the quiet zone.

It is further noted that with respect to the antenna radiating aperture, said antenna radiating aperture especially means a radiating portion of the antenna.

Now, with special respect to the quiet zone especially being of a certain size or a certain shape, respectively, the quiet zone may preferably be of substantially circular or rectangular shape. Additionally or alternatively, the quiet zone may especially be defined by losses and/or field variation below a predefined value such as less than 1 dB or 2 dB or the like.

In addition to this, the quiet zone may typically be provided with plane waves within the certain shape, wherein the plane waves may show a less uniform shape outside of the quiet zone. Furthermore, the respective correction factor is preferably determined through a measurement in the core quiet zone, especially of the certain shape, and outside of the core quiet zone (for instance, see the above-mentioned heat map 42).

In this context, it might be particularly advantageous if in the case that, preferably during measurement, the antenna of the device under test 11 is outside of the quiet zone, especially of the certain shape, the respective correction factor is applied.

With special respect to the case that the quiet zone distribution is unknown, a constant offset may preferably be applied.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measurement method for increasing an effective size of a quiet zone, the measurement method comprising:
when an amplitude or a phase distribution of the quiet zone is pre-calibrated, determining a set of correction factors on the basis of said amplitude or phase distribution of the quiet zone; or
when the amplitude or phase distribution of the quiet zone and an antenna radiating aperture location on a device under test are known, centering the device under test in a middle of the quiet zone and moving the device under test radially in at least one axis;
when the amplitude and phase distribution of the quiet zone is unknown, centering the antenna radiating aperture in the middle of the quiet zone and measuring a first peak gain of a corresponding boresight beam, or
when the amplitude and phase distribution of the quiet zone is unknown, centering the device under test in the middle of the quiet zone and measuring a second peak gain of the corresponding boresight beam, and using an offset between the first peak gain and the second peak gain as a correction factor in the case that the device under test is centered in the quiet zone.

2. The measurement method according to claim 1, wherein a pre-calibration of the amplitude or a phase distribution of the quiet zone is done by:

moving a measurement antenna through the quiet zone in a planar or three-dimensional manner, and measuring amplitude or phase for a set of locations within the quiet zone with an aid of the measurement antenna.

3. The measurement method according to claim 1, wherein the measurement method further comprises:

when the amplitude or phase distribution of the quiet zone and the antenna radiating aperture location on the device under test are known, applying the respective correction factor of the set of correction factors for a desired set of positions of the antenna radiating aperture in the quiet zone.

4. The measurement method according to claim 1, wherein the measurement method further comprises:

assuming that there is a constant distance of the center of the antenna aperture from the center of the quiet zone.

5. A measurement method for increasing an effective size of a quiet zone, the measurement method comprising:

when an amplitude or a phase distribution of the quiet zone is pre-calibrated, determining a set of correction factors on the basis of said amplitude or phase distribution of the quiet zone; or when the amplitude or phase distribution of the quiet zone and an antenna radiating aperture location on a device under test are known, centering the device under test in a middle of the quiet zone and moving the device under test radially in at least one axis;

when the location of at least one antenna of the device under test is unknown, measuring the device under test in at least two orthogonal locations, with at least one corresponding boresight beam and comparing a corresponding peak value differences with the known amplitude or phase distribution of the quiet zone in order to determine the location of the at least one antenna of the device under test.

6. The measurement method according to claim 1, wherein the measurement method further comprises:

increasing the effective size of the quiet zone such that the antenna radiating aperture of the device under test is smaller than a respective diameter of an enlarged quiet zone.

7. A measurement system for increasing an effective size of a quiet zone, the measurement system comprising:

a device under test, a measurement equipment, and a device under test positioner, when an amplitude or a phase distribution of the quiet zone is pre-calibrated, the measurement equipment is configured to determine a set of correction factors on the basis of said amplitude or phase distribution of the quiet zone, or when the amplitude or phase distribution of the quiet zone and an antenna radiating aperture location on the device under test are known, the device under test positioner is configured to center the device under test in the middle of the quiet zone and to move the device under test radially in at least one axis, when the amplitude and phase distribution of the quiet zone is unknown, the device under test positioner is configured to center the antenna radiating aperture in the middle of the quiet zone, wherein the measurement equipment is configured to measure a first peak gain of a corresponding boresight beam, or when the amplitude and phase distribution of the quiet zone is unknown, the device under test positioner is configured to center the device under test in a middle of the quiet zone, wherein the measurement equipment is configured to measure a second peak gain of the corresponding boresight beam, and wherein the measurement equipment is configured to use an offset between the first peak gain and the second peak gain as a correction factor in the case that the device under test is centered in the quiet zone.

8. The measurement system according to claim 7, wherein the measurement system further comprises a measurement antenna being movable through the quiet zone in a planar or three-dimensional manner, wherein for a pre-calibration of the amplitude or a phase distribution of the quiet zone, the measurement equipment is further configured to measure amplitude or phase for a set of locations within the quiet zone with an aid of the movable measurement antenna.

9. The measurement system according to claim 7, when the amplitude or phase distribution of the quiet zone and the antenna radiating aperture location on the device under test are known, the measurement equipment is configured to apply the respective correction factor of the set of correction factors for a desired set of positions of the antenna radiating aperture in the quiet zone.

10. The measurement system according to claim 7, wherein a constant distance of the center of the antenna aperture from the center of the quiet zone is assumed.

11. The measurement system according to claim 7, wherein the measurement equipment is further configured to increase the effective size of the quiet zone such that the antenna radiating aperture of the device under test is smaller than a respective diameter of an enlarged quiet zone.

12. The measurement system according to claim 7, wherein the measurement system further comprises at least one feed antenna configured to transmit or receive signals with respect to the communication between the device under test and the measurement equipment, and wherein the at least one feed antenna is further configured to create the quiet zone on the device under test positioner, wherein the quiet zone comprises a certain shape.

13. The measurement system according to claim 12, wherein the measurement equipment is further configured to apply the respective correction factor outside the certain shape in order to compensate for quiet zone amplitude distribution variations.

14. The measurement system according to claim 7, wherein the measurement system further comprises at least one reflector configured to establish the quiet zone with respect to the device under test, or wherein the measurement system further comprises at least one alignment segment configured to position the at least one reflector.

15. A measurement system for increasing an effective size of a quiet zone, the measurement system comprising:

a device under test, a measurement equipment, and a device under test positioner, when an amplitude or a phase distribution of the quiet zone is pre-calibrated, the measurement equipment is configured to determine a set of correction factors on the basis of said amplitude or phase distribution of the quiet zone, or when the amplitude or phase distribution of the quiet zone and an antenna radiating aperture location on the device under test are known, the device under test positioner is configured to center the device under test in a middle of the quiet zone and to move the device under test radially in at least one axis, and when the location of at least one antenna of the device under test is unknown, the measurement equipment is further configured to measure the device under test in at least two orthogonal locations, with at least one corresponding boresight beam and to compare the corresponding peak value differences with the known amplitude or phase distribution of the quiet zone in order to determine the location of the at least one antenna of the device under test.

* * * * *